US010386243B2

(12) United States Patent
Abughazaleh et al.

(10) Patent No.: US 10,386,243 B2
(45) Date of Patent: Aug. 20, 2019

(54) TEMPERATURE SENSOR CIRCUITRY AND METHOD THEREFOR

(71) Applicant: NXP USA, INC., Austin, TX (US)

(72) Inventors: Firas N. Abughazaleh, Austin, TX (US); Venkata Rama Mohan Reddy Mooraka, Austin, TX (US)

(73) Assignee: NXP USA, Inc., Austin, TX (US)

( * ) Notice: Subject to any disclaimer, the term of this patent is extended or adjusted under 35 U.S.C. 154(b) by 268 days.

(21) Appl. No.: 15/362,092

(22) Filed: Nov. 28, 2016

(65) Prior Publication Data

US 2018/0149526 A1 May 31, 2018

(51) Int. Cl.

| | |
|---|---|
| ***G01K 7/00*** | (2006.01) |
| ***G01K 7/16*** | (2006.01) |
| ***G01K 7/01*** | (2006.01) |
| ***G06F 11/30*** | (2006.01) |
| *G01R 31/28* | (2006.01) |

(52) U.S. Cl.

CPC ................ *G01K 7/16* (2013.01); *G01K 7/01* (2013.01); *G06F 11/3058* (2013.01); *G01R 31/2874* (2013.01)

(58) Field of Classification Search

CPC combination set(s) only.
See application file for complete search history.

(56) References Cited

U.S. PATENT DOCUMENTS

| | | | | |
|---|---|---|---|---|
| 7,327,288 | B2 | 2/2008 | Zoso et al. | |
| 8,262,286 | B2 | 9/2012 | Peterson et al. | |
| 2006/0111865 | A1 | 5/2006 | Choi | |
| 2010/0124251 | A1* | 5/2010 | Peterson .................. | G01K 7/01 374/171 |
| 2010/0166035 | A1* | 7/2010 | Yoon ........................ | G01K 7/01 374/170 |
| 2015/0117495 | A1* | 4/2015 | Tiruvuru ................ | G01K 7/006 374/178 |
| 2015/0300889 | A1 | 10/2015 | Ramaraju et al. | |

OTHER PUBLICATIONS

Pertijs, M., "A CMOS Smart Temperature Sensor With a 3σ Inaccuracy of 0.5C From −50C to 120C", IEEE Journal of Solid-State Circuits, vol. 40, No. 2, Feb. 2005.

* cited by examiner

*Primary Examiner* — Lisa M Caputo
*Assistant Examiner* — Nasir U. Ahmed

(57) ABSTRACT

An on-chip temperature sensor generates a proportional to absolute temperature current and sloped bandgap reference current with transistor offset cancelled using chopping circuitry and dynamic element matching circuitry with resistor-based current mirrors. A digital successive approximation register (SAR) code provided to a digital to analog converter (DAC) is adjusted until current output by the DAC matches the PTAT current.

18 Claims, 8 Drawing Sheets

700

| | | 702 | | | | | | | | 704 | | | | | | | |
|---|---|---|---|---|---|---|---|---|---|---|---|---|---|---|---|---|---|
| CS | DS | 8 | 7 | 6 | 5 | 4 | 3 | 2 | 1 | 8 | 7 | 6 | 5 | 4 | 3 | 2 | 1 |
| 0 | 0 | C | C | C | C | C | C | C | C | A | A | A | A | A | A | A | B |
| | 1 | C | C | C | C | C | C | C | C | A | A | A | A | A | A | B | A |
| | 2 | C | C | C | C | C | C | C | C | A | A | A | A | A | B | A | A |
| | 3 | C | C | C | C | C | C | C | C | A | A | A | A | B | A | A | A |
| | 4 | C | C | C | C | C | C | C | C | A | A | A | B | A | A | A | A |
| | 5 | C | C | C | C | C | C | C | C | A | A | B | A | A | A | A | A |
| | 6 | C | C | C | C | C | C | C | C | A | B | A | A | A | A | A | A |
| | 7 | C | C | C | C | C | C | C | C | B | A | A | A | A | A | A | A |
| 1 | 0 | A | A | A | A | A | A | A | B | C | C | C | C | C | C | C | C |
| | 1 | A | A | A | A | A | A | B | A | C | C | C | C | C | C | C | C |
| | 2 | A | A | A | A | A | B | A | A | C | C | C | C | C | C | C | C |
| | 3 | A | A | A | A | B | A | A | A | C | C | C | C | C | C | C | C |
| | 4 | A | A | A | B | A | A | A | A | C | C | C | C | C | C | C | C |
| | 5 | A | A | B | A | A | A | A | A | C | C | C | C | C | C | C | C |
| | 6 | A | B | A | A | A | A | A | A | C | C | C | C | C | C | C | C |
| | 7 | B | A | A | A | A | A | A | A | C | C | C | C | C | C | C | C |

FIG. 7

TEMPERATURE SENSOR CIRCUITRY AND METHOD THEREFOR

BACKGROUND

Field

This disclosure relates generally to temperature sensor circuitry, and more specifically, to temperature sensor circuitry implemented within a semiconductor device.

Related Art

Today, it is important to monitor temperatures on an integrated circuit (IC) die, or chip. For example, it is important to manage the on-die temperature in a multi-core system on chip (SoC) due to excessive leakage current that results in increases in temperature within the die circuitry. A temperature sensor can be used to monitor the temperature of an electronic component, such as a central processing unit (CPU), graphics processing unit (GPU), microprocessor unit (MPU), SoC, and the like. When a sensed temperature exceeds predetermined thresholds, the sensor may alert circuitry to reduce power consumption and thus reduce the temperature so that overheating that can cause destructive failure to the component may be prevented. In many cases, however, such sensors exhibit poor temperature measurement accuracy and can cause delay in reducing power, subjecting the component to excessive temperatures for longer periods.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 7 illustrates, in a tabular form, exemplary DEM switch arrangement of bandgap reference generator in accordance with an embodiment of the present disclosure.

DETAILED DESCRIPTION

Generally, there is provided, temperature sensing circuitry implemented on a semiconductor integrated circuit that senses the temperature at a site, digitizes the sensed temperature, and then outputs a signal representing such a sensed temperature. The temperature sensing circuitry generates a current signal that is proportional to the sensed temperature using offset cancellation techniques. The current signal is provided to an input of an analog-to-digital converter (ADC). Similar offset cancellation techniques are employed in generation of the bandgap reference signal provided to the ADC. At the completion of a conversion, the ADC provides a digital value more accurately representative of the sensed temperature.

Figure 1:
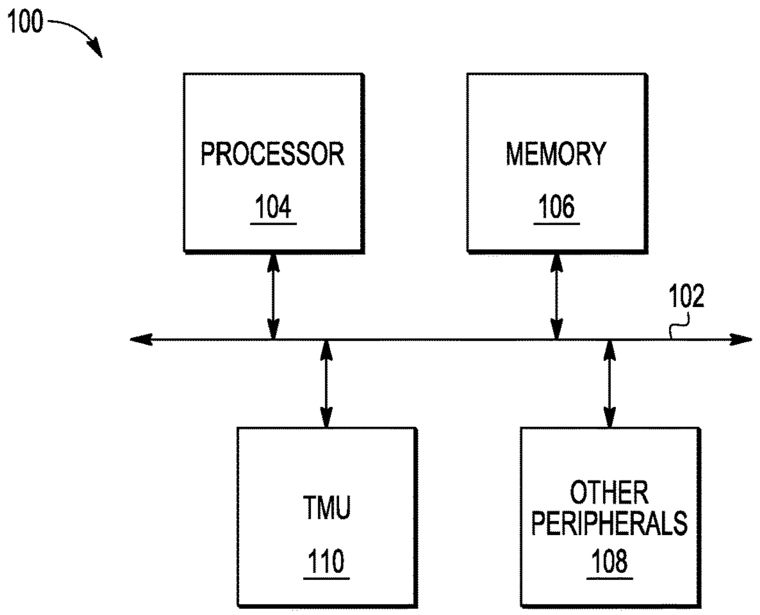
FIG. 1 illustrates, in simplified block diagram form, an integrated circuit in accordance with an embodiment of the present disclosure.

FIG. 1 illustrates, in a simplified block diagram form, an integrated circuit (IC) 100 in accordance with an embodiment of the present disclosure. In some embodiments, integrated circuit 100 may be characterized as a system-on-a-chip (SoC). Integrated circuit 100 includes a system bus 102, processor 104, memory 106, other modules 108, and temperature monitor unit (TMU) 110. Processor 104, memory 106, other modules 108, and TMU 110, are all bi-directionally coupled to the system bus 102. System bus 102 can be any type of bus for communicating any type of information such as data, address, or instructions. Processor 104 may be any type of processor such as a microprocessor (MPU), microcontroller (MCU), digital signal processor (DSP), or other type of processing core. Integrated circuit 100 may include multiple processors like processor 104. Memory 106 may be any type of volatile or non-volatile memory, such as static random access memory (SRAM), dynamic random access memory (DRAM), flash memory, and the like. Memory 106 may also be connected directly to processor 104. Other modules 108 may include any other module such as timer, serial communication, power management, PLL, I/O, and the like for example.

The integrated circuit 100 may be configured for any type of application, such as communication systems, computer systems, sensing devices, etc., and for any one or more of consumer, industrial, commercial, computing, and/or automotive fields. In alternative embodiments, a system such as depicted in FIG. 1 may be implemented in a discrete manner in which the TMU 110 may each be implemented on an IC separate from integrated circuit 100.

Figure 2:
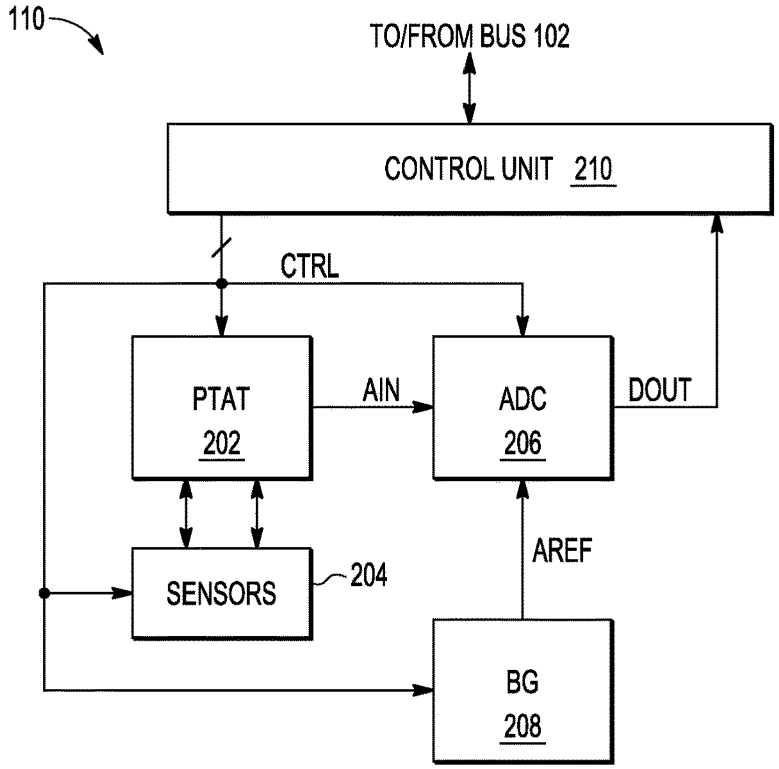
FIG. 2 illustrates, in simplified block diagram form, an exemplary temperature monitor unit (TMU) in accordance with an embodiment of the present disclosure.

FIG. 2 illustrates, in simplified block diagram form, an exemplary TMU 110 in accordance with an embodiment of the present disclosure. TMU 110 includes circuitry such as proportional to absolute temperature (PTAT) generator 202, thermal sensors 204, analog-to-digital converter (ADC) 206, bandgap reference generator (BG) 208, and control unit 210.

The PTAT generator 202 (shown in more detail in FIG. 3) is circuitry coupled to one or more thermal sensors 204. PTAT generator 202 and thermal sensors 204 are each coupled to receive one or more control signals labeled CTRL from control unit 210. PTAT generator 202 provides an output current signal AIN as a function of a temperature sensed by the one or more thermal sensors 204. The thermal sensors 204 may be provided to determine the temperature at corresponding locations on IC 100. The PTAT generator 202 may also be referred to as PTAT generation circuit 202.

The bandgap reference generator 208 (shown in more detail in FIG. 5) is coupled to receive one or more control signals from control unit 210, and provides a reference current signal labeled AREF at an output. In this embodiment, BG 208 may be characterized as a sloped bandgap reference generator 208, having an output current dependent upon temperature, for example.

The ADC 206 (shown in more detail in FIG. 8) is coupled to receive the AIN signal from PTAT 202 and coupled to receive the reference signal AREF output from BG 208.

ADC 206 is coupled to receive one or more control signals from control unit 210 and provides output signal DOUT indicating a digital value representing a sensed temperature.

The control unit 210 includes circuits which generate and provide control signals labeled as CTRL to the PTAT circuitry 202, sensors circuitry 204, ADC circuitry 206, and BG circuitry 208. Control unit 210 includes counters, registers, pointers, increment and decrement circuits, averaging circuitry, and other circuitry for providing control signals to the exemplary TMU 110. The control unit is configured to provide signals to control operation of chopping switch circuitry and dynamic element matching (DEM) circuitry.

Figure 3:
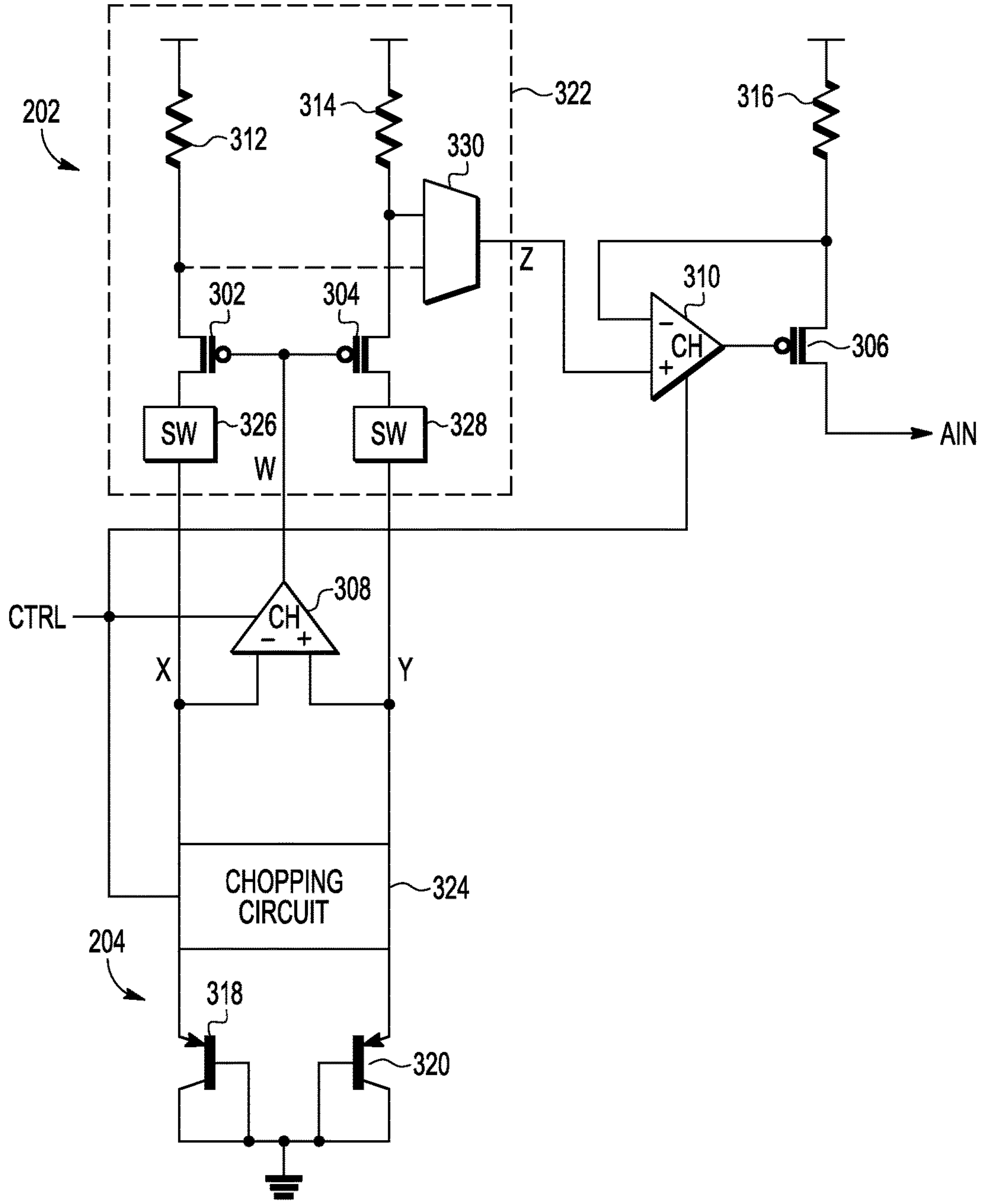
FIG. 3 illustrates, in schematic diagram form, an exemplary proportional to absolute temperature (PTAT) generator and sensor in accordance with an embodiment of the present disclosure.

FIG. 3 illustrates, in simplified schematic form, an exemplary proportional to absolute temperature (PTAT) generator circuit 202 and sensors 204 in accordance with an embodiment of the present disclosure. The PTAT circuit 202 includes a first current mirror and dynamic element matching (DEM) circuitry 322, a first operational amplifier 308, a second operational amplifier 310, a source-follower P-channel transistor 306, and a first resistor 316. The first current mirror includes P-channel transistors 302 and 304 coupled in series with respective resistors 312 and 314 and corresponding branch nodes X and Y. The DEM circuit 322 also includes switches 326 and 328 and multiplexer circuit 330 coupled to receive CTRL control signals (not shown) and configured to rotate components of first and second branches of the first current mirror. The DEM circuit 322 is illustrated in more detail with exemplary switch arrangement in FIG. 4. Resistors 312, 314, and 316 may also be referred to as resistive elements.

A first terminal of resistor 312 is coupled to a first voltage supply terminal and a second terminal of resistor 312 is coupled to a first current electrode of transistor 302. A first terminal of resistor 314 is coupled to the first voltage supply terminal and a second terminal of resistor 314 is coupled to a first current electrode of transistor 304. A second current electrode of transistor 302 is coupled by way of switch 326 to a negating input of first operational amplifier 308 at node X and a second current electrode of transistor 304 is coupled by way of switch 328 to a non-negating input of operational amplifier 308 at node Y. Control electrodes of transistors 302 and 304 are coupled to an output of operational amplifier 308 at node labeled W. A nominal operating voltage, typically referred to as VDD, may be provided at the first voltage supply terminal.

A first terminal of resistor 316 is coupled to the first voltage supply terminal and a second terminal of resistor 316 is coupled to a first current electrode of transistor 306 and a negating input of operational amplifier 310. A non-negating input of operational amplifier 310 is coupled to an output of multiplexer 330. An output of operational amplifier 310 is coupled to a control electrode of transistor 306 and a second current electrode of transistor 306 is coupled to provide a current signal at an output labeled AIN of the ADC 206 of FIG. 2. In this embodiment for example, the current signal may be representative of a sensed temperature.

Sensors 204 includes exemplary PNP bipolar junction transistors (BJT) 318 and 320 coupled to the PTAT circuit 202. In this embodiment, base electrode and collector electrode of transistor 318 are coupled to a second voltage supply terminal, and likewise, base electrode and collector electrode of transistor 320 are coupled to the second voltage supply terminal. The voltage provided at the second voltage supply terminal may be characterized as ground.

Chopping circuit 324 is coupled between emitter electrode of transistor 318 and the first input of operational amplifier 308 and between emitter electrode of transistor 320 and the second input of operational amplifier 308. Chopping circuit 324 is configured to reduce mismatch between components of sensor 204 coupled to the PTAT 202. Chopping circuitry is also included in operational amplifiers 308 and 310 having schematic symbols notated with CH. Chopping circuit 324 and chopping circuitry included in operational amplifiers 308 and 310 are each coupled to receive control signals. For example, control signal labeled CTRL may include one or more separate or unique control signals for each of the chopping circuit 324 and chopping circuitry included in operational amplifiers 308 and 310. Chopping circuitry included in operational amplifiers 308 and 310 can be configured to swap the inputs to operational amplifier 308 and 310. Chopping circuitry in operational amplifier 308 can be used to reduce offset error of inputs and mismatch between X and Y branches of the current mirror formed by transistors 302 and 304. Chopping circuitry in operational amplifier 310 can be used to reduce offset error of input (control electrode) and mismatch between source follower transistor 306 and the current mirror formed by transistors 302 and 304. Chopping circuit 324 can be used to reduce offset error of input to sensor 204 by periodically alternating input to transistors 318 and 320.

In the embodiment illustrated in FIG. 3, resistor 312 and series coupled transistor 302 is sized sufficiently larger than respective resistor 314 and series coupled transistor 304 while BJTs 318 and 320 are sized approximately the same. For example, a width of transistor 302 may be sized seven times larger than a width of transistor 304, thus establishing a 7:1 ratio of current capacity of transistor 302 over transistor 304. In this embodiment, resistor 312 and transistor 302 each include seven equal segments having each segment sized similar to respective resistor 314 and transistor 304, thus establishing seven current units in the X current branch and one current unit in the Y current branch.

Figure 4:
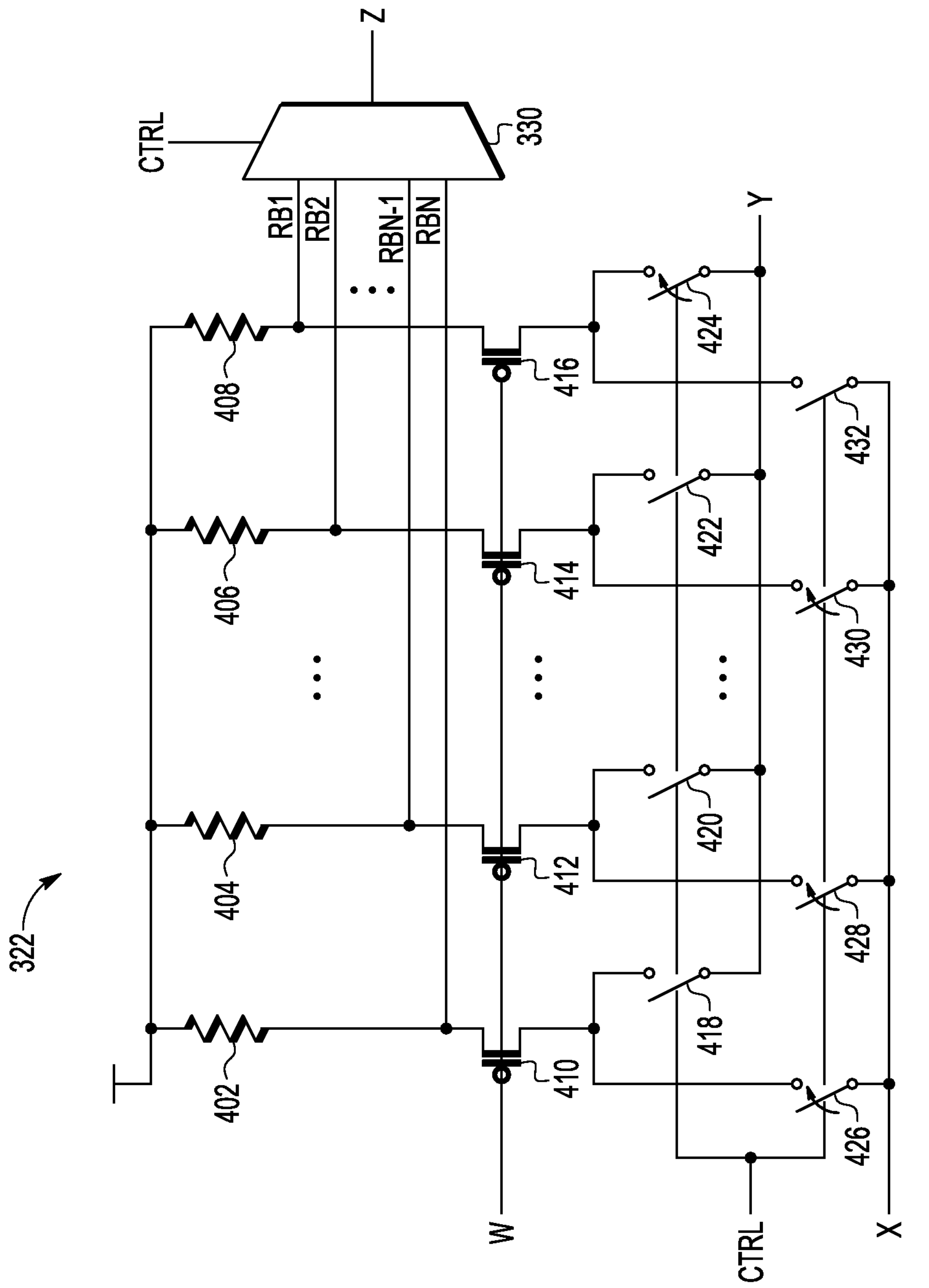
FIG. 4 illustrates, in schematic diagram form, exemplary dynamic element matching (DEM) circuitry of PTAT generator in accordance with an embodiment of the present disclosure.

FIG. 4 illustrates, in schematic diagram form, exemplary dynamic element matching (DEM) circuitry 322 of PTAT generator 202 in accordance with an embodiment of the present disclosure. Exemplary DEM circuit 322 includes resistor segments 402-408 corresponding to resistors 312 and 314, transistor segments 410-416 corresponding to transistors 302 and 304, switches 426-432 corresponding to switch circuit 326, switches 418-424 corresponding to switch circuit 328, and multiplexer 330. Switches 418-432 and multiplexer 330 are controlled by control signals CTRL from the control unit 210. Each resistor segment 402-408 has a first terminal coupled to first voltage supply terminal and a second terminal coupled to a first current electrode of respective transistors 410-416 at nodes labeled RB1-RBN. Multiplexer 330 includes signal inputs coupled to nodes RB1-RBN and an output coupled to an input of operational amplifier 310 at node labeled Z. A second current electrode of transistors 410-416 is coupled to respective switches 418-432. A control electrode of transistors 410-416 is coupled to the output of operational amplifier 308 at node W. Resistor segments 402-408 are formed of any suitable resistive elements, each having substantially similar dimensions, materials, and structure. In this embodiment, DEM circuit 322 includes eight (N=8) substantially equal resistor segments depicted as resistors 402-408 in FIG. 4. Likewise, DEM circuit 322 includes eight (N=8) substantially equal transistor segments depicted as transistors 410-416 in FIG. 4. A series coupled resistor segment and transistor segment form a current segment, for example, a set formed with resistor 402 coupled in series with transistor 410. Series coupled resistor and transistor current segments are configured with switches 418-432 and multiplexer 330 to establish a 7:1 ratio of current capacity of transistor 302 over transistor 304. Each of the eight series coupled resistor and transistor current segments can be grouped in any manner to establish the desired 7:1 ratio using switches 418-432 and multiplexer 330. In this manner, components such as series coupled resistor and transistor current segments can be rotated or grouped to eliminate offsets in PTAT generator 202.

For example during a first iteration, series coupled current segments including resistors 402-406 and P-channel transistors 410-414 form a group of seven current units coupled to node X via closed switches 426-430. Series coupled current segment including resistor 408 and P-channel transistor 416 form a single current unit coupled to node Y via closed switch 424. Resistor 408 branch node RB1 is selectively coupled to node Z via multiplexer 330 and control signal CTRL. During a second iteration, switches 422 and 432 may be closed and switches 424 and 430 may be open to rotate to a next current segment including resistor 406 and P-channel 414 and coupled to node Y. Resistor 406 branch node RB2 is selectively coupled to node Z via multiplexer 330 and control signal CTRL. The remaining seven current segments are grouped and coupled to node X maintaining the desired 7:1 ratio. Rotation of current segments can continue in subsequent iterations until all eight set have be rotated. Measurements taken at each iteration can be summed and averages or otherwise mathematically manipulated to reduce or eliminate unwanted variation and offsets.

Figure 5:
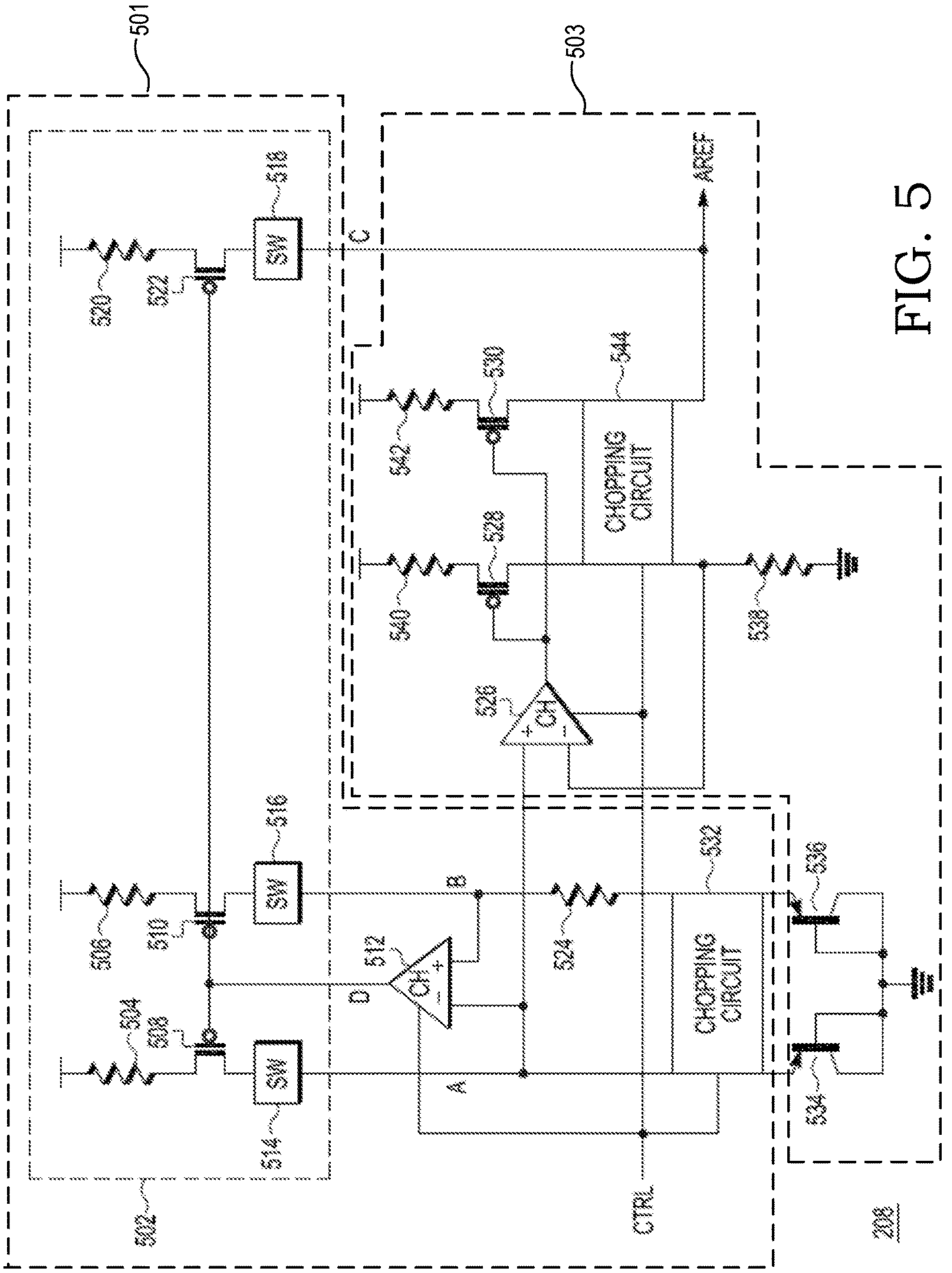
FIG. 5 illustrates, in schematic diagram form, an exemplary bandgap reference generator in accordance with an embodiment of the present disclosure.

FIG. 5 illustrates, in schematic diagram form, exemplary bandgap reference generator 208 in accordance with an embodiment of the present disclosure. The bandgap reference generator (BG) 208 includes proportional to absolute temperature (PTAT) circuitry 501 and complementary to absolute temperature (CTAT) circuitry 503. In this embodiment, BG 208 is characterized as a sloped bandgap reference generator.

The PTAT circuitry 501 includes a first current mirror with associated dynamic element matching (DEM) circuitry 502, and a first operational amplifier 512. The first current mirror includes P-channel transistors 508, 510, and 522 coupled in series with respective resistors 504, 506, and 520 and corresponding branch nodes labeled A, B, and C. The DEM circuitry includes switches 514, 516, and 518 configured to rotate components of first branch A and second branch B of the first current mirror, and swap components of the A and B branches with components of third branch C of the first current mirror during alternate DEM cycles. DEM switches 514, 516, and 518 are configured to reduce mismatch between the A and B branches and C branch of the current mirror formed with transistors 508, 510, and 522. The first operational amplifier 512 includes inputs coupled to branch nodes A and B, and an output coupled to provide an input to the first current mirror. The first operational amplifier 512, notated with CH, includes chopping circuitry configured to swap the inputs to the first operational amplifier and to reduce mismatch between A and B branches of the current mirror formed with transistors 508, 510, and 522. Resistors 504, 506, and 520 may be referred to as resistive elements.

A first terminal of resistor 504 is coupled to a first voltage supply terminal and a second terminal of resistor 504 is coupled to a first current electrode of transistor 508. A nominal operating voltage, typically referred to as VDD, may be provided at the first voltage supply terminal. A first terminal of resistor 506 is coupled to the first voltage supply terminal and a second terminal of resistor 506 is coupled to a first current electrode of transistor 510. A second current electrode of transistor 508 is coupled to a negating input of first operational amplifier 512 through switch 514 and a second current electrode of transistor 510 is coupled to a non-negating input of first operational amplifier 512 through switch 516. A first terminal of resistor 520 is coupled to the first voltage supply terminal and a second terminal of resistor 520 is coupled to a first current electrode of transistor 522. A second current electrode of transistor 522 is coupled through switch 518 to provide an output signal labeled AREF to the ADC 206 of FIG. 2. Control electrodes of transistors 508, 510, and 522 are coupled to an output of first operational amplifier 512 at node labeled D. A first terminal of resistor 524 is coupled to the non-negating input of first operational amplifier 512.

The CTAT circuitry 503 includes a second operational amplifier 526, a second current mirror, PNP bipolar junction transistors (BJT) 534 and 536, and voltage-to-current conversion resistor 538. The BJTs 534 and 536 are coupled to the PTAT circuit. Base electrode and collector electrode of transistor 534 are coupled to a second voltage supply terminal, and likewise, base electrode and collector electrode of transistor 536 are coupled to the second voltage supply terminal. The voltage provided at the second voltage supply terminal may be characterized as ground. Emitter electrode of transistor 534 is coupled to the first input of operational amplifier 512 through chopping circuit 532 and emitter electrode of transistor 536 is coupled to a second terminal of resistor 524 through chopping circuit 532. Chopping circuit 532 is configured to swap the A and B branches coupled to BJTs 534 and 536 and to reduce mismatch between components of a sensor (BJTs 534 and 536).

The second current mirror includes P-channel transistors 528 and 530 coupled in series with respective resistors 540 and 542. A first terminal of resistor 540 is coupled to the first voltage supply terminal and a second terminal of resistor 540 is coupled to a first current electrode of transistor 528. A first terminal of resistor 542 is coupled to the first voltage supply terminal and a second terminal of resistor 542 is coupled to a first current electrode of transistor 530. A second current electrode of transistor 528 is coupled to a negating input of operational amplifier 526 and a first terminal of resistor 538 through chopping circuit 544. A second terminal of resistor 538 is coupled to the second voltage supply terminal, and a second current electrode of transistor 530 is coupled to node C through chopping circuit 544. Chopping circuit 544 is configured to swap first and second branches of the second current mirror and to reduce mismatch between the first and second branches. Node C is characterized as a summing node with outputs from the first current mirror and the second current mirror forming output signal AREF. A non-negating input of operational amplifier 526 is coupled to the negating input of operational amplifier 512. Control electrodes of transistors 528 and 530 are coupled to an output of operational amplifier 526. Second operational amplifier 526, notated with CH, includes chopping circuitry configured to swap the negating and non-negating inputs to the second operational amplifier and to reduce mismatch between A branch and the first terminal of voltage-to-current conversion resistor 538.

In this embodiment, resistors 524 and 538 are formed from the same material and structure. In operation, a $\Delta V_{BE}$ voltage may be established across resistor 524. In this embodiment, transistor 508 is sized sufficiently larger than transistor 510 while BJTs 534 and 536 are sized and constructed similar to one another. For example, a width of transistor 508 may be sized seven times larger than a width of transistor 510, thus establishing a 7:1 ratio of current capacity of transistor 510 over transistor 508. In this embodiment, transistor 522 is substantially equal to transistors 508 and 510 combined. For example, if transistor 508 includes seven segments of equal width and transistor 510 includes one segment of similar width establishing a 7:1 ratio, then a desired width of transistor 522 would be substantially equal to eight segments of equal width.

Along with chopping circuit 532, chopping circuitry is included in operational amplifiers 512 and 526 having schematic symbols notated with CH. Chopping circuit 532 and chopping circuitry included in operational amplifiers 512 and 526 are each coupled to receive one or more control signals. Switch circuits 514-518 are also coupled to receive one or more control signals. For example, control signal labeled CTRL may include one or more separate or unique control signals for each of the chopping circuit 532, chopping circuitry included in operational amplifiers 512 and 526, and switches 514-518. Chopping circuitry in operational amplifier 512 can be used to reduce offset error of input to the current mirror formed by transistors 508 and 510. Chopping circuitry in operational amplifier 526 can be used to reduce offset error of input to the current mirror formed by transistors 528 and 530. Chopping circuit 532 can be used to reduce offset error of transistors 534 and 536 by periodically alternating input to operational amplifier 512.

Figure 6:
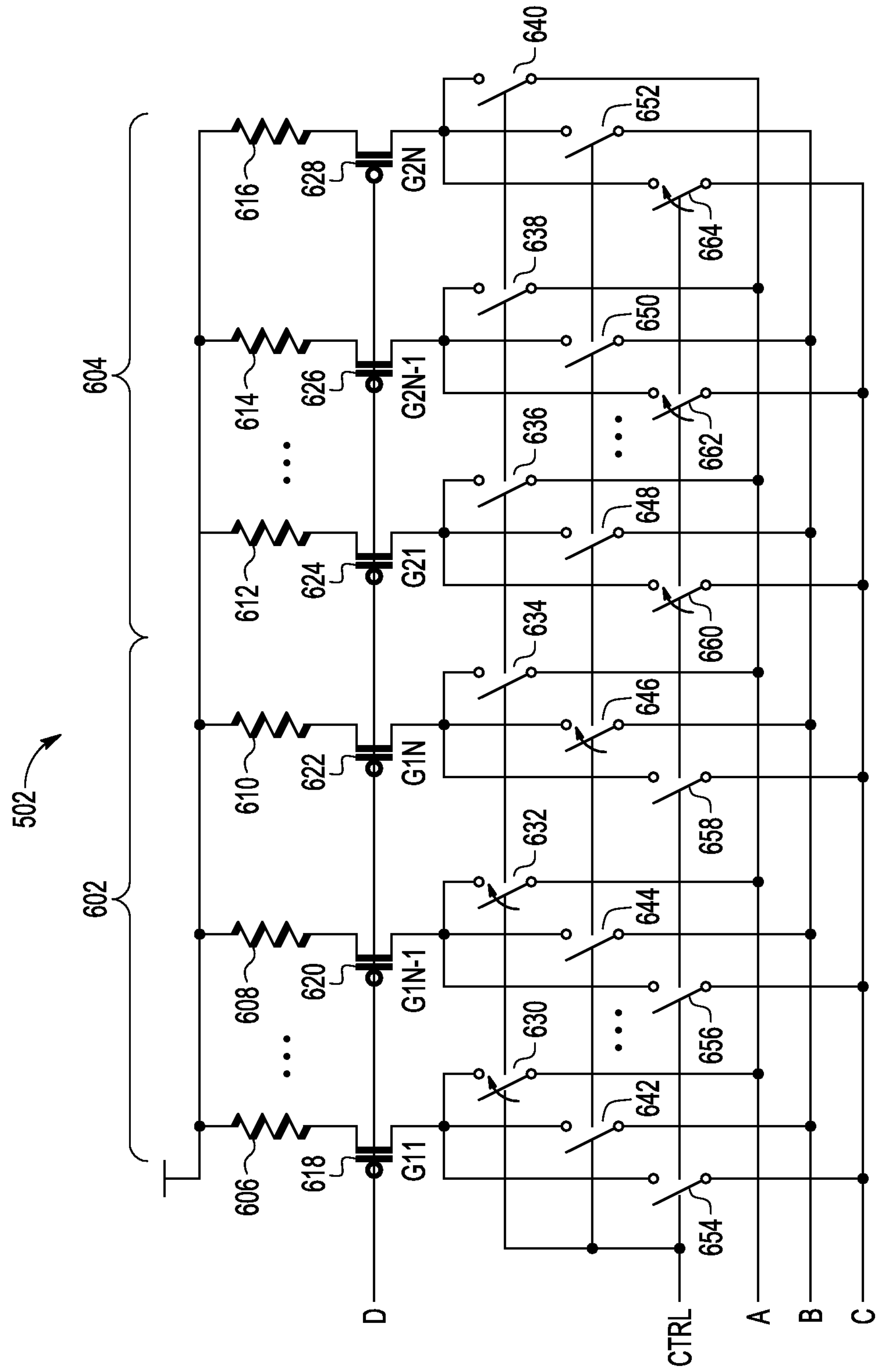
FIG. 6 illustrates, in schematic diagram form, exemplary DEM circuitry of bandgap reference generator in accordance with an embodiment of the present disclosure.

FIG. 6 illustrates, in schematic diagram form, exemplary implementation of first current mirror with dynamic element matching (DEM) circuitry 502 in accordance with an embodiment of the present disclosure. Exemplary DEM circuit 502 includes resistor segments 606-616 corresponding to resistors 504, 506, and 520, transistor segments 618-628 corresponding to transistors 508, 510, and 522, switches 630-640 corresponding to switch circuit 514, switches 642-652 corresponding to switch circuit 516, and switches 654-664 corresponding to switch circuit 518. Switches 630-664 are controlled by control signals CTRL from the control unit 210. Each resistor segment 606-616 has a first terminal coupled to first voltage supply terminal and a second terminal coupled to a first current electrode of respective transistor segment 618-628. A second current electrode of transistor segments 618-628 is coupled to respective switches 630-664 at nodes labeled G11-G1N and G21-G2N. A control electrode of transistor segments 618-628 is coupled to the output of first operational amplifier 512 at node D. A nominal operating voltage, typically referred to as VDD, may be provided at the first voltage supply terminal. Resistor segments 606-616 are formed of any suitable resistive elements, each having substantially similar dimensions, materials, and structure.

In this embodiment, DEM circuitry 502 includes 16 substantially equal resistor segments depicted as resistors 504, 506, and 520 in FIG. 5. Likewise, DEM circuitry 502 includes 16 substantially equal transistor segments depicted as transistors 508, 510, and 522 in FIG. 5. A series coupled resistor segment and transistor segment form a current segment having a current unit. For example, a current segment having one current unit is formed with resistor 606 coupled in series with transistor 618. Series coupled resistor and transistor current segments are configured in two groups with switches 630-664, a first group 602 consisting of eight current segments to establish a 7:1 current ratio of PTAT branch currents with seven current units at branch node A and one current unit at branch node B. A second group 604 consisting of the remaining eight current segments establish a copy of the PTAT branch currents at branch nodes A and B. For example, each of the 16 series coupled resistor and transistor current segments can be grouped in any arrangement of eight current segments to establish the desired 7:1 current ratio using switches 630-664. In this manner, components such as series coupled resistor and transistor current segments can be rotated and grouped to eliminate offsets in bandgap reference generator 208.

In this embodiment, series coupled current segments including resistors 606-616 and P-channel transistors 618-628 are arranged in two groups, a first group of eight current segments to establish a 7:1 ratio at branch nodes A and B in the first current mirror and a second group of eight current segments to establish a current at branch node C representing a copy of current at branch node A plus current at branch node B. For convenience of description, current segments of the first group 602 are labeled G11-G1N and current segments of the second group 604 are labeled G21-G2N, where N*2 equals the total number of current segments. In this embodiment, N=8. For example during a first iteration, a 7:1 ratio in the first current mirror is formed with a group of seven current segments (e.g., G11 through G1N−1) coupled to branch node A via closed switches 630-632, and a single current segment (e.g., G1N) coupled to branch node B via closed switch 646. The remaining group of eight current segments (e.g., G21 through G2N) are coupled to branch node C of the first current mirror via closed switches 660-664. During a second iteration, first and second groups of current segments can be swapped. Switches 654-658 may be closed to couple a group of eight current segments (e.g., G11 through G1N) to branch node C of the first current mirror. Switches 636-638 and 652 may be closed to couple a group of seven current segments (e.g., G21 through G2N−1) to branch node A and a single current segment (e.g., G1N) coupled to node B, establishing the desired 7:1 ratio in the first current mirror. Swapping and rotation of current segments can continue in subsequent iterations in any order until all desired current segments have be swapped and rotated. Measurements taken at each iteration can be summed and averaged or otherwise mathematically manipulated to reduce or eliminate unwanted variation and offsets. It should be understood that current segments are not limited to groups 602 and 604, each current segment may be swapped, rotated, and grouped with any other current segments in any manner desired.

FIG. 7 illustrates, in a tabular form, exemplary chopping and DEM switch arrangement 700 of bandgap reference generator 208 in accordance with an embodiment of the present disclosure. The chopping and DEM switch arrangement 700 illustrates operating states and switch positions of the 8+8 arrangement of current segments depicted in FIG. 6. The chopping and DEM switch arrangement 700 includes a chopping state (CS) column, a DEM state (DS) column, and two groups of eight columns 702 and 704. CS column includes two states, CS0 and CS1. DS column includes two groups of states DS0-7, a first group of rows corresponding to CS0 and a second group of rows corresponding to CS1. The two groups 702 and 704 each having eight columns numbered 1-8 correspond to groups 602 and 604 respectively, each including eight current segments. The table entries are illustrated by way of the following example.

The output of chopping operational amplifier 512 is coupled to P-channel transistor segments of current segments included groups 602 and 604 at node D in FIGS. 5 and 6. The chopping circuitry portion of operational amplifier 512 is configured to swap the inputs to the operational amplifier portion. The chopping circuitry includes a first chopping operation state CS0 and a second chopping operation state CS1. For convenience of description, switches which couple current segments with branch node A may be referred to as A-switches, switches which couple current segments with branch node B may be referred to as B-switches, and switches which couple current segments with branch node C may be referred to as C-switches.

In a first chopping operation (CS0), the eight current segments included in group 602 are all coupled to branch node C by closing all of the C-switches in group 602, and the eight current segments included in group 604 are split among branch nodes A and B by closing seven A-switches and one B-switch in group 604. For each DS cycle (0-7) within chopping state CS0, a different B-switch is closed while maintaining a 7:1 current ratio with the remaining seven A-switches being closed. In a first DS cycle depicted as the CS0, DS0 row, each entry corresponding to the eight columns 1-8 in group 702 are labeled C, indicating that the eight current segments included in group 602 are all coupled to branch node C. Likewise, a first entry corresponding to the column 1 in group 704 is labeled B and remaining entries corresponding to the eight columns 2-8 in group 704 are labeled A, indicating that seven current segments included in group 604 are coupled to branch node A and one current segment in group 604 is coupled to branch node B to establish the desired 7:1 current ratio. In a next DS cycle depicted as the CS0, DS1 row, all entries remain the same except for column 2 entry in group 704 is now labeled B and column 1 entry in group 704 is now labeled A, indicating that the 7:1 current ratio is maintained while choosing a different current segment to be coupled to branch node B. In subsequent DS cycles (CS0, DS2-7 rows), the single current segment can be rotated by opening the previous B-switch and closing a different B-switch and repeating until all current segments have been rotated to branch node B. Measurements taken at each cycle can be summed and averaged or otherwise mathematically manipulated to reduce or eliminate unwanted variation, mismatch and offset errors.

In a second chopping operation (CS1), the eight current segments included in group 604 are all coupled to branch node C by closing all of the C-switches in group 604, and the eight current segments included in group 602 are split among branch nodes A and B by closing seven A-switches and one B-switch in group 602. For each DS cycle (0-7) within chopping state CS1, a different B-switch is closed while maintaining a 7:1 current ratio with the remaining seven A-switches being closed. In a DS cycle depicted as the CS1, DS0 row, each entry corresponding to the eight columns 1-8 in group 704 are labeled C, indicating that the eight current segments included in group 604 are all coupled to branch node C. Likewise, a first entry corresponding to the column 1 in group 702 is labeled B and remaining entries corresponding to the seven columns 2-8 in group 702 are labeled A, indicating that seven current segments included in group 602 are coupled to branch node A and one current segment in group 602 is coupled to branch node B to establish the desired 7:1 current ratio. In subsequent DS cycles (CS1, DS1-7 rows), the single current segment can be rotated by opening the previous B-switch and closing a different B-switch and repeating until all current segments have been rotated to branch node B. Measurements taken at each cycle can be summed and averaged or otherwise mathematically manipulated to reduce or eliminate unwanted variation, mismatch and offset errors.

While the above describes cycling through each DS state (DS0-7) for a given chopping state operation (e.g., CS0), it may be desirable to alternate chopping state operations CS0 and CS1 for each DS state (DS0-7). For example, for a first DS state (DS0) it may be desirable to perform a CS0 and CS1 operation before rotating to a next current segment in a next DS state (DS1). This order of chopping operations and DEM cycling may be useful to cancel or reduce flicker noise, in addition to reduce or eliminate offset errors.

Figure 8:
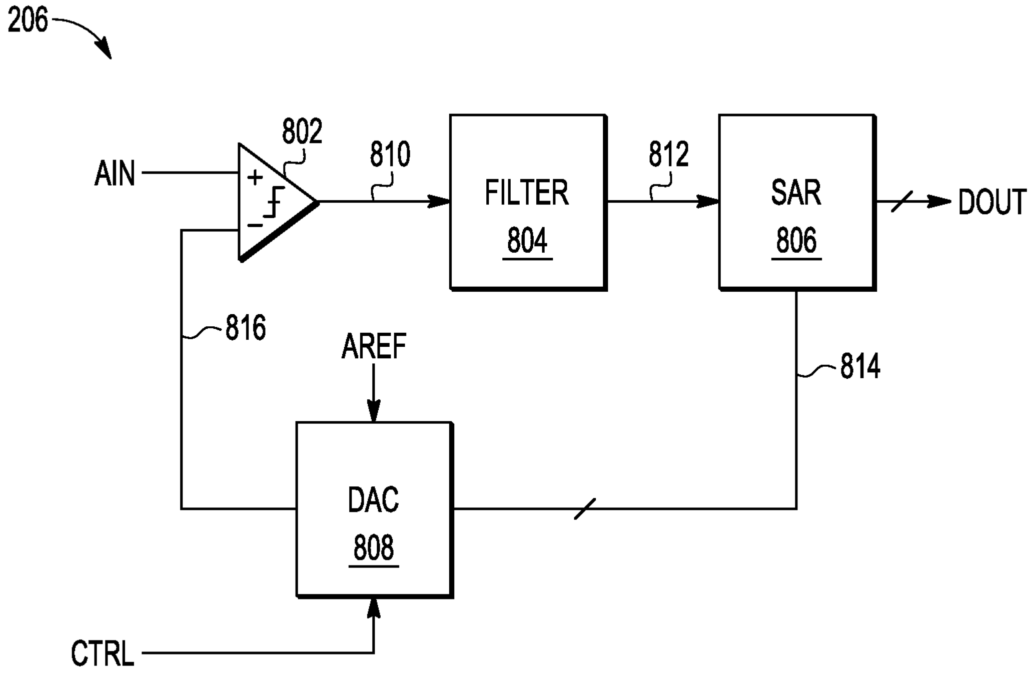
FIG. 8 illustrates, in block diagram form, an exemplary analog to digital converter (ADC) in accordance with an embodiment of the present disclosure.

FIG. 8 illustrates, in block diagram form, a more detailed representation of exemplary analog-to-digital converter (ADC) 206 of FIG. 2 in accordance with an embodiment of the present disclosure. ADC 206 includes a current comparator 802, a digital filter 804, a successive approximation register (SAR) 806, and a digital-to-analog converter (DAC) 808. The comparator 802 is coupled to receive the AIN signal at a first input, the AIN signal being a sensed temperature current output from the PTAT current generator 202. The comparator 802 is coupled to receive an output signal from the DAC 808 at a second input, the DAC output signal being a current signal corresponding to a digital code provided to the DAC 808. An output 810 of comparator 802 provides a signal indicating a difference between the sensed temperature current from the PTAT and the output from the DAC 808. Filter 804, at an input, is coupled to receive the resulting signal output from comparator 802, and provides at an output 812 a filtered difference signal from the comparator 802 to the SAR 806. During iterations of an ADC conversion, the SAR 806 receives the filtered signal and provides at an output 814, an SAR digital code to the DAC 808 based on the received signal. The SAR digital code may be characterized as a digital value representing the sense temperature. The DAC 808 receives the digital code from the SAR 806 at a first input, and reference current AREF at a second input. In turn, the DAC 808 provides, at an output 816, a current based on the digital code. At the end of the ADC conversion, a digital result labeled DOUT is provided at an output of SAR 806. The resulting digital signal DOUT is provided to an input of control unit 210.

Figure 9:
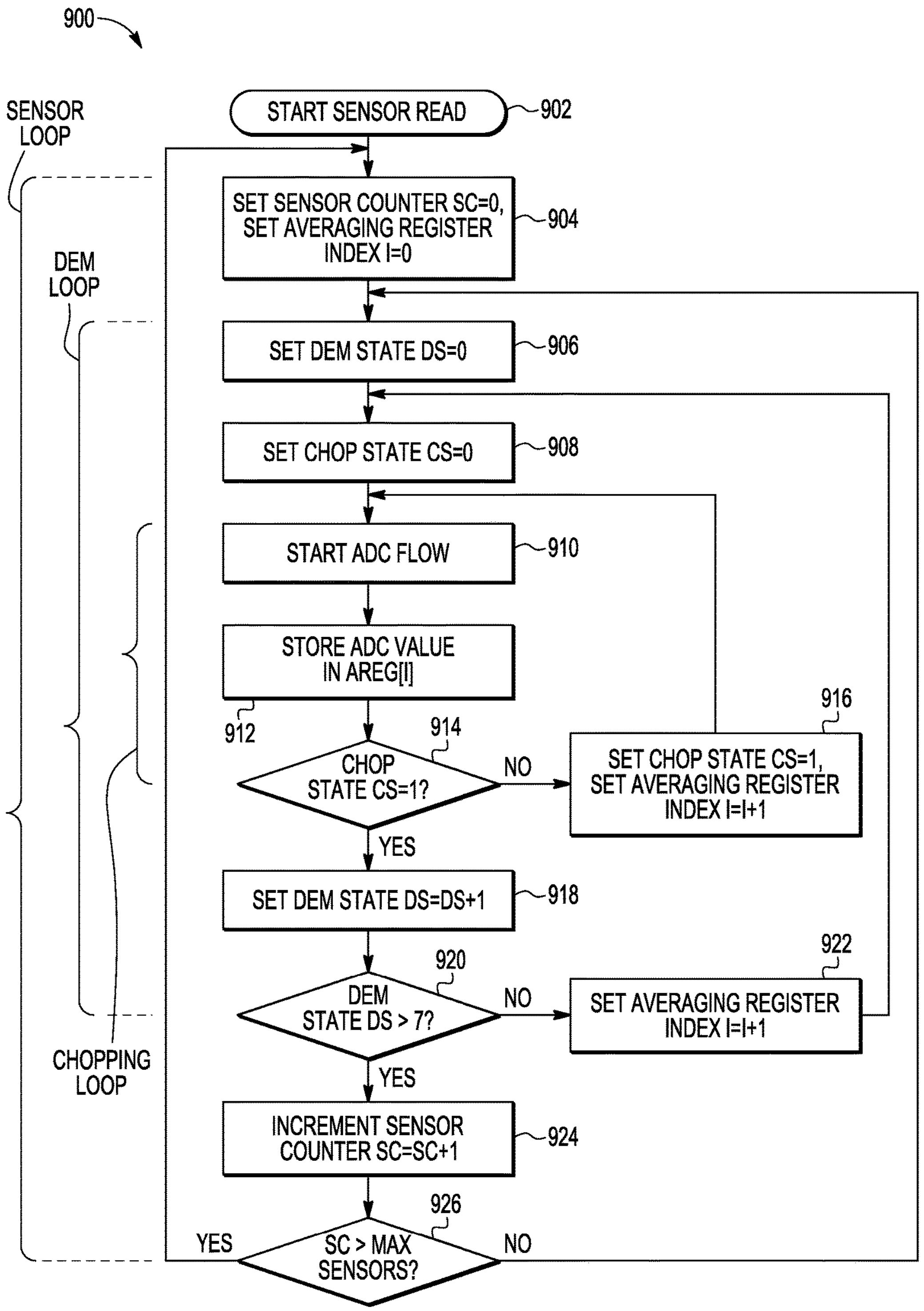
FIG. 9 illustrates, in flow chart diagram form, an exemplary sensor read flow in accordance with an embodiment of the present disclosure.

FIG. 9 illustrates, in flow chart diagram form, an exemplary sensor read flow 900 in accordance with an embodiment of the present disclosure. The sensor read flow 900 includes a chopping loop portion, a dynamic element matching (DEM) loop portion and a sensor loop portion. At step 902, a sensor read operation is started. At step 904, the sensor loop is initiated by setting sensor counter variable SC to 0 (SC=0) and setting averaging register (AREG) index variable I to 0 (1=0) in control unit 210. The sensor counter counts the number of sensors being read. The averaging register includes storage locations for ADC conversion results. Each stored conversion value may be stored in locations corresponding to an averaging register index value I. At step 906, the DEM loop is initiated by setting DEM state variable DS to 0 (DS=0). At step 908, the chopping loop is initiated by setting chopping state CS to 0 (CH=0).

At step 910, an analog-to-digital (ADC) flow is started. ADC 206 provides a successive approximation register conversion on the AIN current signal output from PTAT generator 202. The ADC conversion result is stored in averaging register AREG at step 912. The stored conversion value may be stored at a location corresponding to the averaging register AREG index value I. After storing the ADC conversion result, determine whether chopping state variable CS=1 at step 914. If the chopping state variable CS=0 (NO), then continue to step 916. At step 916, set chopping state variable CS to 1 and increment AREG index variable value by setting I to I+1 (I=I+1). When chopping state variable CS=1, the chopping circuitry such as embedded in chopping operational amplifiers 308, 310, 512, and 526, can swap inputs to the operational amplifier portion, for example. After setting chopping state variable CS=1, continue flow at step 910. If the chopping state variable CS=1 (YES), then continue to step 918. At step 918, increment DEM state variable value by setting DS to DS+1 (DS=DS+1).

At step 920, determine whether the DEM state variable value is greater than 7. If the DEM state variable DS has a value less than or equal to 7 (NO), then continue to step 922. At step 922, increment AREG index variable value by setting I to I+1 (I=I+1) and continue DEM loop at step 908. In this embodiment, the DEM loop includes eight DEM states (DS values 0-7). For each DEM state, two chopping states (CS values 0 and 1) are performed. If the DEM state variable DS>7 (YES), then continue to step 924.

At step 924, increment sensor counter variable by setting SC to SC+1 (SC=SC+1). At step 926, determine whether the sensor counter variable value is greater than the maximum number of sensors. The maximum number of sensors may be constrained to the performance of the TMU system, for example. If the sensor counter variable SC has a value less than or equal to a maximum number of sensors (NO), then continue at step 906. If the sensor counter variable SC has a value greater than the maximum number of sensors (YES), then continue sensor loop at step 904.

Generally, there is provided, an integrated circuit including: a temperature monitor unit that includes: an analog to digital converter (ADC); a proportional to absolute temperature (PTAT) current generator configured to output a sensed temperature current to the ADC; and a bandgap reference generator configured to output a reference current to a digital to analog converter in the ADC, wherein the bandgap reference generator includes: a PTAT portion having: a first current mirror comprised of first, second and third transistors corresponding to first, second, and third branches; a first operational amplifier coupled to provide an input to the first current mirror, wherein the first operational amplifier includes a negating input coupled to a first transistor of the first current mirror and a non-negating input coupled to a second transistor of the first current mirror; dynamic element matching (DEM) circuitry configured to rotate components of the first and second branches of the first current mirror, and to swap components of the first and second branches with components of the third branch of the first current mirror during alternate cycles; first chopping circuitry coupled to the first operational amplifier; and a complementary to absolute temperature (CTAT) portion having: a second current mirror having first and second branches; a second operational amplifier coupled to provide an input to the second current mirror, wherein the second operational amplifier includes a non-negating input coupled to the first transistor of the first current mirror and a negating input coupled to ground; second chopping circuitry coupled to the second operational amplifier; third chopping circuitry configured to swap the first and second branches of the second current mirror; and a summing node coupled to an output the third branch of the first current mirror and an output of the second current mirror to provide an analog reference signal. The bandgap reference generator may further include a first switch circuit coupled to a first current electrode of the first transistor in the first current mirror; a second switch circuit coupled to a first current electrode of the second transistor in the first current mirror; and a third switch circuit coupled to a first current electrode of an output transistor in the PTAT portion of the bandgap reference generator. The first current mirror may include a first resistor including a first terminal coupled to a voltage supply terminal and a second terminal coupled to a second current electrode of the first transistor; a second resistor including a first terminal coupled to the voltage supply terminal and a second terminal coupled to a second current electrode of the second transistor; and a third resistor including a first terminal coupled to the voltage supply terminal and a second terminal coupled to a second current electrode of the third transistor. The second current mirror may include a fourth transistor; a fifth transistor; a fourth resistor including a first terminal coupled to the voltage supply terminal and a second terminal coupled to a second current electrode of the fourth transistor; and a fifth resistor including a first terminal coupled to the voltage supply terminal and a second terminal coupled to a second current electrode of the fifth transistor. The integrated circuit may further include a control unit coupled to the PTAT current generator, the ADC, and the bandgap reference generator, wherein the control unit is configured to provide signals to control operation of the first, second and third switch circuits, the first chopping circuitry, and the first DEM circuitry. The PTAT current generator may include a third current mirror comprised of first and second transistors; a third operational amplifier, wherein the third operational amplifier includes a negating input coupled to the first transistor of the third current mirror and a non-negating input coupled to the second transistor of the third current mirror, and an output coupled to control electrodes of the first and second transistors of the third current mirror; and second dynamic element matching circuitry configured to rotate components in the third current mirror over a number of cycles. The PTAT current generator may further include a fourth operational amplifier coupled to receive an output of the third current mirror at a first input, a second input coupled to a current electrode of a source follower transistor, and an output coupled to a control electrode of the source follower transistor. The integrated circuit may further include sensor circuitry coupled to the PTAT current generator, the sensor circuitry including: a first bipolar junction transistor; a second bipolar junction transistor; and fourth chopping circuitry configured to swap input between the first and second bipolar junction transistors to cancel mismatch between the first and second bipolar junction transistors. The third current mirror in the PTAT current generator may further include a first resistor including a first terminal coupled to the voltage supply terminal and a second terminal coupled to a second current electrode of the first transistor of the third current mirror; and a second resistor including a first terminal coupled to the voltage supply terminal and a second terminal coupled to a second current electrode of the second transistor of the third current mirror. The digital to analog converter may be configured to receive a successive approximation register (SAR) code and a reference current; and the ADC may further include a comparator configured with a first input coupled to the sensed temperature current from the PTAT current generator and a second input coupled to output from the digital to analog converter, and to output a signal indicating a difference between the sensed temperature current from the PTAT and the output from the DAC. The ADC may further include a successive approximation register (SAR) configured to output a signal indicating a digital value representing the sensed temperature; and a filter configured to receive the signal indicating the difference between the sensed temperature current from the PTAT and the output from the DAC from the comparator and to provide a filtered value of the difference between the sensed temperature current from the PTAT and the output from the DAC from the comparator to the SAR.

In another embodiment, there is provided, a method of operating a thermal monitor unit including: using a first chopping circuit in a first operational amplifier to reduce mismatch between first and second branches of a first current mirror of a proportional to absolute temperature (PTAT) section of the thermal monitor unit; using a second chopping circuit in a second operational amplifier to reduce mismatch between a source follower transistor in the PTAT section of the thermal monitor unit and the first current mirror; using a third chopping circuit in a third operational amplifier to reduce mismatch between first and second branches of a second current mirror in a bandgap section of the thermal monitor unit; using a fourth chopping circuit to reduce mismatch between the first and second branches and a third branch of the second current mirror in the bandgap section of the thermal monitor unit; using a fifth chopping circuit in a fourth operational amplifier to reduce mismatch between a first branches of the first current mirror and a first terminal of voltage-to-current conversion resistor in the bandgap section of the thermal monitor unit; and using a sixth chopping circuit to reduce mismatch between first and second branches of a third current mirror in the bandgap section of the thermal monitor unit. The method may further include dynamic element matching (DEM) by rotating components of the first and second branches of the second current mirror, and to swap components of the first and second branches of the second current mirror with components of the third branch of the second current mirror during alternate cycles. The method may further include adding resistance at first current electrodes of transistors in the first current mirror. The method may further include adding resistance at first current electrodes of transistors in the second current mirror. The method may further include using a seventh chopping circuit to reduce mismatch between components of a sensor coupled to the PTAT section by swapping input to the components of the sensor. The method may further include using an eighth chopping circuit to reduce mismatch between components of a sensor coupled to the bandgap section by swapping input to the components of the sensor coupled to the bandgap section. The method may further include comparing current output from the PTAT section to an output of a digital to analog converter (DAC) in a comparator; and filtering an output of the comparator in a filter. The method may further include providing an output of the filter to a successive approximation register (SAR); and generating a SAR code and a digital output in the SAR, wherein the digital output represents a temperature sensed in the PTAT section. The method may further include providing a reference current from the bandgap section to an input of the DAC and the SAR code to a second input of the DAC.

By now it should be appreciated that there has been provided, temperature sensing circuitry implemented on a semiconductor integrated circuit that senses the temperature at a site, digitizes the sensed temperature, and then outputs a signal representing such a sensed temperature. The temperature sensing circuitry generates a current signal that is proportional to the sensed temperature using offset cancellation techniques provided herein. The current signal is provided to an input of an analog-to-digital converter (ADC). Similar offset cancellation techniques are employed in generation of the bandgap reference signal provided to the ADC. At the completion of a conversion, the ADC provides a digital value more accurately representative of the sensed temperature.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a temperature monitor unit that includes:
an analog to digital converter (ADC);
a proportional to absolute temperature (PTAT) current generator configured to output a sensed temperature current to the ADC; and
a bandgap reference generator configured to output a reference current to a digital to analog converter in the ADC, wherein the bandgap reference generator includes:
a PTAT portion having:
a first current mirror comprised of first, second and third transistors corresponding to first, second, and third branches;
a first operational amplifier coupled to provide an input to the first current mirror, wherein the first operational amplifier includes a negating input coupled to a first transistor of the first current mirror and a non-negating input coupled to a second transistor of the first current mirror;
dynamic element matching (DEM) circuitry configured to rotate components of the first and second branches of the first current mirror, and to swap components of the first and second branches with components of the third branch of the first current mirror during alternate cycles;
first chopping circuitry coupled to the first operational amplifier; and
a complementary to absolute temperature (CTAT) portion having:
a second current mirror having first and second branches;
a second operational amplifier coupled to provide an input to the second current mirror, wherein the second operational amplifier includes a non-negating input coupled to the first transistor of the first current mirror and a negating input coupled to ground;
second chopping circuitry coupled to the second operational amplifier;
third chopping circuitry configured to swap the first and second branches of the second current mirror; and
a summing node coupled to an output the third branch of the first current mirror and an output of the second current mirror to provide an analog reference signal, wherein the bandgap reference generator further includes:
a first switch circuit coupled to a first current electrode of the first transistor in the first current mirror;
a second switch circuit coupled to a first current electrode of the second transistor in the first current mirror; and
a third switch circuit coupled to a first current electrode of an output transistor in the PTAT portion of the bandgap reference generator.

2. The integrated circuit of claim 1, wherein:
the first current mirror includes:
a first resistor including a first terminal coupled to a voltage supply terminal and a second terminal coupled to a second current electrode of the first transistor;
a second resistor including a first terminal coupled to the voltage supply terminal and a second terminal coupled to a second current electrode of the second transistor; and
a third resistor including a first terminal coupled to the voltage supply terminal and a second terminal coupled to a second current electrode of the third transistor.

3. The integrated circuit of claim 2, wherein:
the second current mirror includes:
a fourth transistor;
a fifth transistor;
a fourth resistor including a first terminal coupled to the voltage supply terminal and a second terminal coupled to a second current electrode of the fourth transistor; and
a fifth resistor including a first terminal coupled to the voltage supply terminal and a second terminal coupled to a second current electrode of the fifth transistor.

4. The integrated circuit of claim 1, further comprising:
a control unit coupled to the PTAT current generator, the ADC, and the bandgap reference generator, wherein the control unit is configured to provide signals to control operation of the first, second and third switch circuits, the first chopping circuitry, and the first DEM circuitry.

5. The integrated circuit of claim 1, wherein the PTAT current generator includes:
a third current mirror comprised of first and second transistors;
a third operational amplifier, wherein the third operational amplifier includes a negating input coupled to the first transistor of the third current mirror and a non-negating input coupled to the second transistor of the third current mirror, and an output coupled to control electrodes of the first and second transistors of the third current mirror; and second dynamic element matching circuitry configured to rotate components in the third current mirror over a number of cycles.

6. The integrated circuit of claim 5, wherein the PTAT current generator further includes:

a fourth operational amplifier coupled to receive an output of the third current mirror at a first input, a second input coupled to a current electrode of a source follower transistor, and an output coupled to a control electrode of the source follower transistor.

7. The integrated circuit of claim 5, wherein the third current mirror in the PTAT current generator further includes:

a first resistor including a first terminal coupled to the voltage supply terminal and a second terminal coupled to a second current electrode of the first transistor of the third current mirror; and a second resistor including a first terminal coupled to the voltage supply terminal and a second terminal coupled to a second current electrode of the second transistor of the third current mirror.

8. The integrated circuit of claim 1, further comprising:

sensor circuitry coupled to the PTAT current generator, the sensor circuitry including:

a first bipolar junction transistor;

a second bipolar junction transistor; and fourth chopping circuitry configured to swap input between the first and second bipolar junction transistors to cancel mismatch between the first and second bipolar junction transistors.

9. The integrated circuit of claim 1, wherein:

the digital to analog converter is configured to receive a successive approximation register (SAR) code and a reference current; and the ADC further includes a comparator configured with a first input coupled to the sensed temperature current from the PTAT current generator and a second input coupled to output from the digital to analog converter, and to output a signal indicating a difference between the sensed temperature current from the PTAT and the output from the DAC.

10. The integrated circuit of claim 9, wherein the ADC further includes:

a successive approximation register (SAR) configured to output a signal indicating a digital value representing the sensed temperature; and a filter configured to receive the signal indicating the difference between the sensed temperature current from the PTAT and the output from the DAC from the comparator and to provide a filtered value of the difference between the sensed temperature current from the PTAT and the output from the DAC from the comparator to the SAR.

11. A method of operating a thermal monitor unit comprising:

using a first chopping circuit in a first operational amplifier to reduce mismatch between first and second branches of a first current mirror of a proportional to absolute temperature (PTAT) section of the thermal monitor unit;

using a second chopping circuit in a second operational amplifier to reduce mismatch between a source follower transistor in the PTAT section of the thermal monitor unit and the first current mirror;

using a third chopping circuit in a third operational amplifier to reduce mismatch between first and second branches of a second current mirror in a bandgap section of the thermal monitor unit;

using a fourth chopping circuit to reduce mismatch between the first and second branches and a third branch of the second current mirror in the bandgap section of the thermal monitor unit;

using a fifth chopping circuit in a fourth operational amplifier to reduce mismatch between a first branches of the first current mirror and a first terminal of voltage-to-current conversion resistor in the bandgap section of the thermal monitor unit;

using a sixth chopping circuit to reduce mismatch between first and second branches of a third current mirror in the bandgap section of the thermal monitor unit; and dynamic element matching (DEM) by rotating components of the first and second branches of the second current mirror, and to swap components of the first and second branches of the second current mirror with components of third branch of the second current mirror during alternate cycles.

12. The method of claim 11, further comprising:

adding resistance at first current electrodes of transistors in the first current mirror.

13. The method of claim 12, further comprising:

adding resistance at first current electrodes of transistors in the second current mirror.

14. The method of claim 13, further comprising:

using an eighth chopping circuit to reduce mismatch between components of a sensor coupled to the bandgap section by swapping input to the components of the sensor coupled to the bandgap section.

15. The method of claim 14, further comprising:

comparing current output from the PTAT section to an output of a digital to analog converter (DAC) in a comparator; and filtering an output of the comparator in a filter.

16. The method of claim 14, further comprising:

providing an output of the filter to a successive approximation register (SAR); and generating a SAR code and a digital output in the SAR, wherein the digital output represents a temperature sensed in the PTAT section.

17. The method of claim 16 further comprising:

providing a reference current from the bandgap section to an input of the DAC and the SAR code to a second input of the DAC.

18. The method of claim 12, further comprising:

using a seventh chopping circuit to reduce mismatch between components of a sensor coupled to the PTAT section by swapping input to the components of the sensor.

* * * * *